United States Patent [19]

Böhme

[11] Patent Number: 4,855,626

[45] Date of Patent: * Aug. 8, 1989

[54] CONTROLLABLE INTEGRATOR

[75] Inventor: Rolf Böhme, Bad Friedrichshall, Fed. Rep. of Germany

[73] Assignee: Telefunken electronic GmbH, Heilbronn, Fed. Rep. of Germany

[ * ] Notice: The portion of the term of this patent subsequent to Mar. 29, 2005 has been disclaimed.

[21] Appl. No.: 192,092

[22] Filed: Mar. 28, 1988

Related U.S. Application Data

[63] Continuation of Ser. No. 706,294, Feb. 26, 1985.

[30] Foreign Application Priority Data

Mar. 7, 1984 [DE] Fed. Rep. of Germany ....... 3408220

[51] Int. Cl.$^4$ .......................... G06G 7/12; G06G 7/18
[52] U.S. Cl. ................... 307/491; 307/494; 307/521; 328/127
[58] Field of Search ............... 307/490, 491, 494, 520, 307/521; 328/127, 128, 167

[56] References Cited

U.S. PATENT DOCUMENTS 3,805,091  4/1974  Colin ..................................... 327/167
4,374,335  2/1983  Fukahori et al. .................... 307/521
4,734,598  3/1988  Bohme ................................ 307/491

FOREIGN PATENT DOCUMENTS 2760331  3/1978  Fed. Rep. of Germany .
3323277  12/1983  Fed. Rep. of Germany .

Primary Examiner—Stanley D. Miller
Assistant Examiner—Trong Q. Phan
Attorney, Agent, or Firm—Spencer & Frank

[57] ABSTRACT

A controllable integrator for a bipolar integrated filter includes a voltage-current-transformer, a current distribution multiplier and an integrating amplifier. The voltage-current-transformer includes two transistors having their emitters connected via a converting resistor and two current sources each connected to a respective one of the emitters of the two transistors. The current distribution amplifier includes two logarithmic diodes each connected to a respective one of the collectors of the two transistors, a differential stage having differential inputs connected to the two logarithmic diodes, a controllable current source for supplying current to the differential stage, and a current mirror having an output and comprising two transistors of one conductivity type having emitters connected to a source of supply voltage and collectors connected to the output of the differential stage. The integrating amplifier includes an inverting amplifier having an input circuit including an input transistor of the one conductivity type, the input transistor having a base connected to the output of the current mirror and an emitter connected to the same source of supply voltage.

1 Claim, 3 Drawing Sheets

CONTROLLABLE INTEGRATOR

CROSS-REFERENCE TO RELATED APPLICATION

This application is a continuation of copending application Ser. No. 06/706,294, filed Feb. 26, 1985.

BACKGROUND OF THE INVENTION

Controllable integrators may be used for the realization of analogue filter circuits in bipolar semiconductor technology. They are suitable for the low and medium frequency range. Controllable integrators may be manufactured by means of conventional, standard processes of bipolar technology. The dependency on temperature of the filter characteristic may be compensated by the controllability of the integrator, and advantageous applications are possible with adjustable or controlled filters. For various reasons, filter circuits without inductors comprising identical, integrating amplifiers which are connected to one another by chain connection and summing elements are preferred. Such filter circuits exhibit a high repetition part degree, are highly flexible in design, and may be rendered low-noise and relatively insensitive of tolerances by means of suitable design methods.

It is well known that the characteristics of discretely designed filters and filter circuits in important points cannot be attained by methods of integration technologies. Suitable inductors cannot be manufactured and may only be substituted by the methods of the active RC circuits. The available capacitances are small and of low quality. Diffused or implanted resistors are temperature-dependent and clearly non-linear. Technological difficulties rapidly increase at values above a few 10s of kiloohms. Under these circumstances, special measures must be taken if selective circuits with border frequencies or resonances below approximately 20 kilohertz are to be realized.

SUMMARY OF THE INVENTION

It is an object of the invention to indicate a controllable integrator for filter circuits which may be manufactured by means of the bipolar standard technologies, and which expands the frequency range of selective circuits in the direction of lower frequencies.

According to the invention, there is provided in a controllable integrator for bipolar integrated filters a voltage current transformer, a current distribution multiplier and an integrating amplifier, wherein the voltage current transformer comprises two transistors whose emitters are connected via a converting resistor, and which are supplied by two current sources connected to the emitters, wherein the current distribution multiplier comprises logarithmic diodes, a differential stage and a current mirror, wherein the logarithmic diodes are acted upon by the collector currents of the two transistors, and wherein the differential stage is supplied by a preferably controllable current source and acts on the current mirror whose output is connected to the input of the integrating amplifier.

BRIEF DESCRIPTION OF THE DRAWINGS

The invention will now be described in greater detail, by way of examples, with references to the drawings, in which.

DESCRIPTION OF THE PREFERRED EMBODIMENTS

Figure 1:
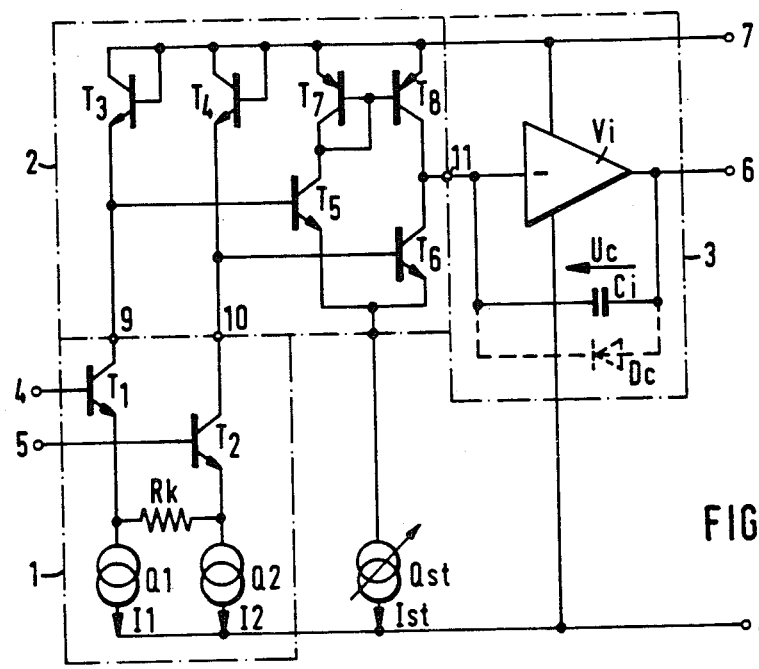
FIG. 1 is a circuit schematic which shows a controllable integrator according to the invention.

FIG. 1 shows a controllable integrator according to the invention. The voltage-current-transformer 1 of the integrator in FIG. 1 consists of the transistors T1 and T2 and the current sources Q1 and Q2 which are connected on the emitter side, with the converting resistor Rk being connected between the emitters of these transistors. The current sources are preferably identical to each other and consist, in accordance with the state of the art, of transistors connected to a common base voltage. This base voltage need only be generated once, even for several integrators. The base connections of transistors T1 and T2 constitute the differential input of the circuit. Emitter followers may also precede these inputs in order to increase the input resistance. For the currents flowing via connections 9, 10 from the voltage-current-transformer 1 to the current-distribution-multiplier 2, called multiplier for short, there is obtained, if Rk is large with respect to the internal resistances of the emitters, $I9 = I + (U5 - U4)/Rk$ and $I10 = I - (U5 - U4)/Rk$, with the currents I1 and I2 of the current sources Q1 and Q2 being assumed as identical ($I1 = I2 = I$). U4 and U5 are the voltages of the two inputs in relation to a reference point which is not determined more exactly. It may be, for example, the supply terminal 8 or an additional ground point. In the multiplier 2, the currents I9 and I10 act upon the transistors T3 and T4 connected as diodes. The voltage difference which occurs is fed to the differential stage formed by T5 and T6. This differential stage acts on the current mirror formed by transistors T7 and T8 so that the difference of the currents flows via terminal 11 through T5 and T6 to the integrating amplifier 3. The current Ist of the current source Qst provides the multiplication effect. As may be derived with the somewhat simplified characteristic curve equation $Ic = Ico * \exp(Ube/Ut)$ of the bipolar transistor (with Ic being the collector current, Ube the base emitter voltage, $Ut = kT/q$ the temperature voltage, and Ico the transfer residual current), $I11 = (U4 - U5) * Ist/(Rk * 2 * I)$. This relationship shows the multiplying influence of the current Ist, and it is remarkable that the non-linearity of the characteristic curve of the transistor (within the scope of the approaches made) does not have any effect on the linearity of the multiplier. Experience has shown that a deviation of less than 0.5 per cent may easily be achieved. If there is sufficiently large amplification of the amplifier of the functional unit integrating amplifier 3, $U6 = \int I11 \, dt/Ci + U60 = \int(U4-U5) * Ist * dt/(Rk * I * Ci) + U60$. Here, Ci stands for the integration capacitance, and U60 for the initial value of the output voltage U6, again seen against the reference point which is not shown in greater detail. Proper functioning of the unit comprised of transistors T5 to T8 is possible only when the potential at terminal 11 is approximately one forward voltage lower than the potential at supply terminal 7, more particularly, for the illustrated types of conduction npn/pnp of the bipolar transistors. Then it is also ensured that a barrier-layer capacitance located parallel to the integration capacitor Ci which may be used to advantage may never enter the forward direction.

From FIG. 1 the improvements attained over the current state of the art are also apparent. The chosen configuration of the voltage-current-transformer permits the generation of differences without the usual summing stages which require an additional operational amplifier and at least three resistors. Only a single resistor Rk is required, which has a favourable effect on the surface requirements. If the current sources Q1 and Q2 are represented by simple transistor current sources, there is a common-mode range of less than two forward voltages above the lower supply voltage UB at terminal 8, and less than one forward voltage below the upper supply voltage U7 at terminal 7. The circuit thus makes good use of the supply voltage provided, and it is also well suited relatively low supply voltages U7–U8. Since Rk is not transversed by a rest current, its modulation is symmetrical, and the influence of its non-linearity is slight. For Ist<2*I, the current I11 becomes smaller and the time constant of the integrator larger. In a filter circuit formed by these integrators, the filter characteristic is converted to lower values. Since it is not difficult to generate current ratios of 100 and more, there is a substantial expansion of the frequency range which can be covered in terms of filter technology towards lower frequencies. By setting or controlling the current source Qst, the filter characteristic may be adjustably closed or controlled in a signal-dependent manner. The temperature dependency of the RC product may also be rendered ineffective by selecting and generating a suitable temperature dependency of all of the current sources of a filter circuit.

Figure 2:
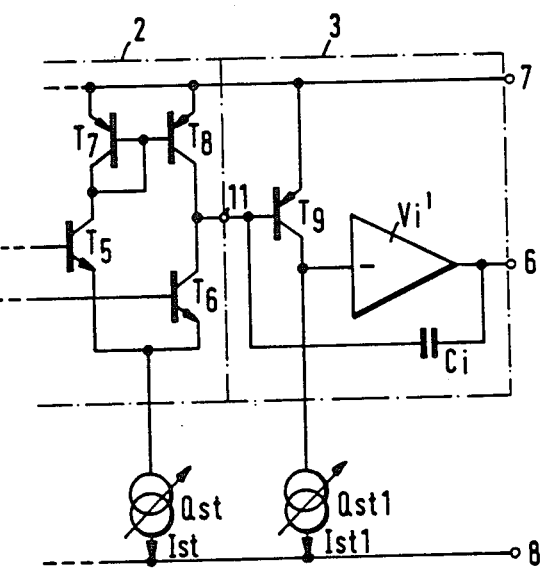
FIG. 2 is a circuit schematic which shows a preferred input stage of the controllable integrator according to the invention.

It has already been mentioned that the input of the inverting amplifier Vi must have a rest potential close to the supply potential at terminal 7. This is achieved easiest by forming the input stage from one transistor T9 whose emitter is connected to the supply line 7 and whose base forms input 11 (FIG. 2). The transistor T9 must be of the same conduction type as the transistors T7, T8 of the current mirror.

In the current mirror circuit used, the base current of transistors T7 and T8 disturbs the symmetry of the arrangement. The base current of the input transistor T9 of the amplifier Vi also constitutes a disturbance. These disturbances do, however, eliminate one another if the input transistor T9 has the same base current as the two transistors T7 and T8 of the current mirror. This may be set by a suitable dimensioning for a certain value of the control current Ist. A compensation that is independent of the control current Ist may, however, also be achieved by connecting the collector of the input transistor T9 to a further controllable current source Qst1 which should have the same current Ist1=Ist as the control source Qst. The remaining part Vi' of the inverting amplifier Vi must not branchoff any current, i.e., it must have a high-resistance input.

It may preferably be a simple impedance transformer with high current amplification. The best symmetry and thus compensation are achieved if the emitter base diode of the input transistor T9 has exactly twice the surface area of that of one of the current mirror transistors T7, T8, or if the input transistor consists of a parallel circuit comprising two transistors identical to T7 and T8.

The integrated capacitances of the bipolar technology are preferably set up in such a way that the low-resistance emitter zone of a large-surface auxiliary transistor is used for the one electrode, and a conduction path surface for the other electrode. Both electrodes are insulated from each other by means of the grown oxide. It is quite possible to connect one or both barrier-layers of the auxiliary transistor parallel to the emitter conduction path capacitance if the applied voltage does not change its sign, and if dependency of the barrier-layer capacitance on the applied voltage is permissible. The suggested type of integrator 3 permits use of a barrier-layer capacitance since the input potential of the inverting amplifier Vi is close to the supply voltage, and there can be no sign change of the voltage decreasing across the capacitor Ci during normal modulation. It is therefore possible to save 30% of the required crystal surface or more.

Figure 3:
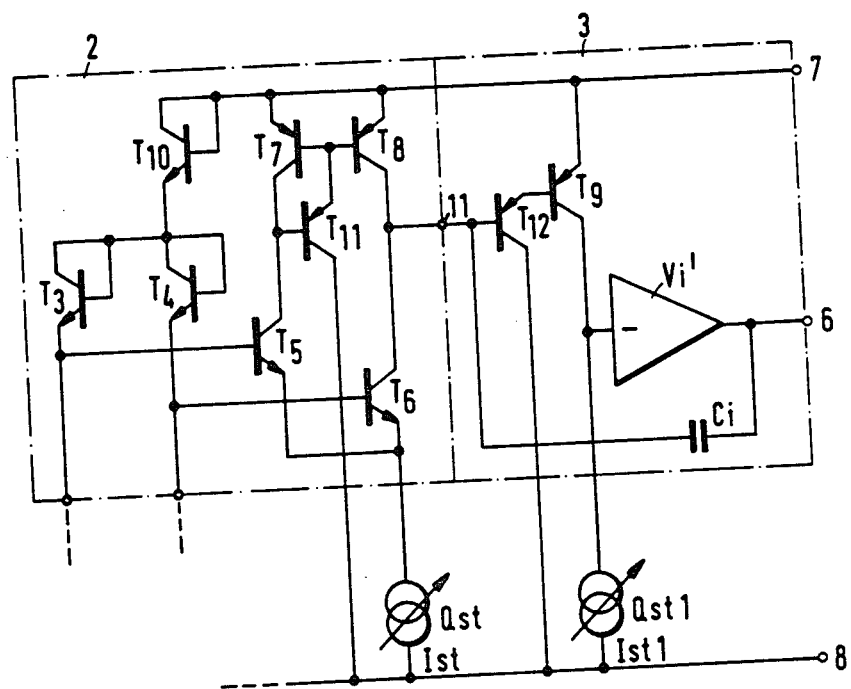
FIG. 3 is a circuit schematic which shows means for lessening the influence of the base currents.

The described compensation of the base currents will never be perfect owing to leakages of the circuit components and other influences. The base currents also result in a certain non-linearity. This may be lessened in an arrangement according to FIG. 3 by means of additional transistors. To this end, an emitter follower T12 is made to precede the input transistor T9 of the inverting amplifier Vi. The connection of the two bases of transistor T7 and T8 to the collector of T7 is likewise replaced by an emitter follower T11. The load symmetry is thereby once again fully established, now on a lower level. In order to avoid saturation of transistors T5 and T6 of the differential stage, the potential of the logarithmic diodes T3 and T4 must be lowered. This is attained by connecting the logarithmic diodes T3 and T4 to the supply voltage via a further transistor T10 connected as a diode, or via a resistor.

Figure 4:
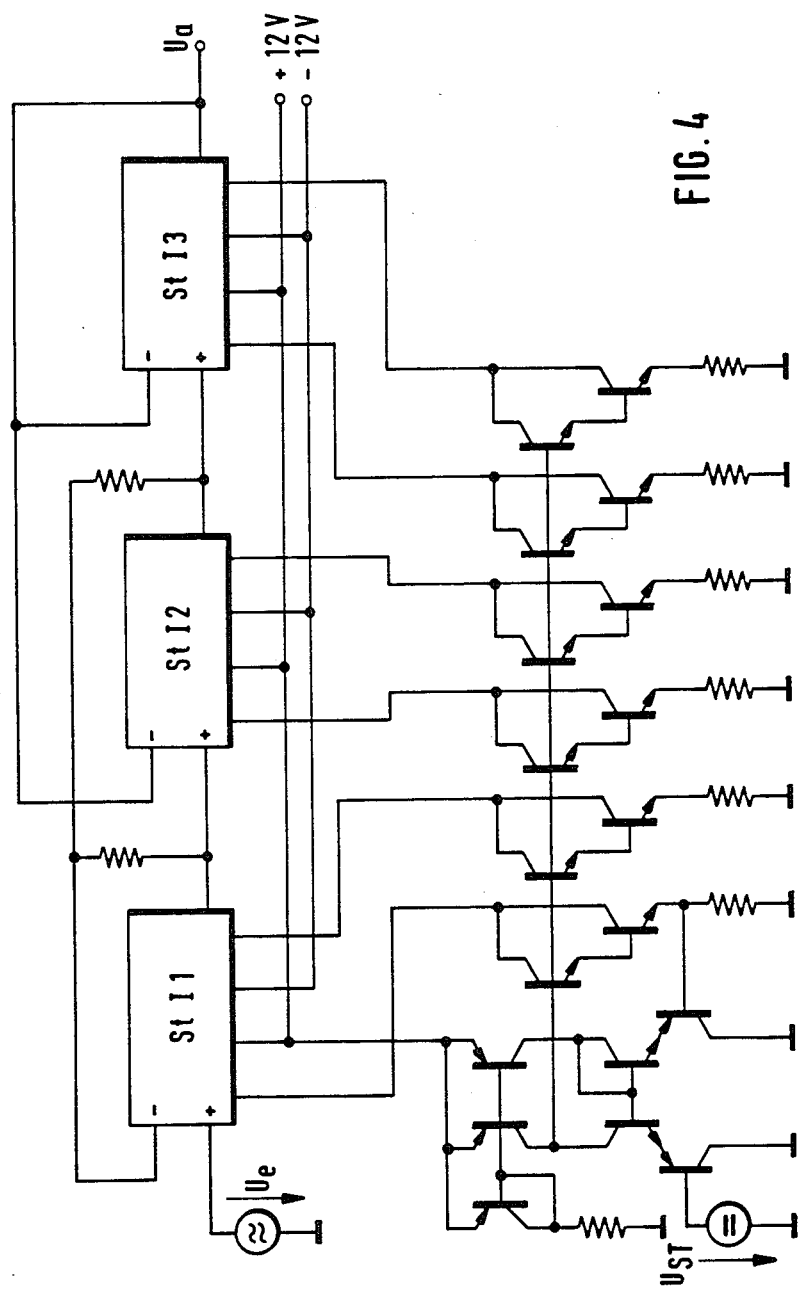
FIG. 4 is a circuit schematic in partial block diagram form which shows the circuit of a power low-pass filter.

FIG. 4 shows the circuit of a power low-pass filter which was developed according to a method provided by Gensel (Telecommunication Technology 12—(1972), page 3). The second controllable integrator StI2 is designed with twice the integration capacitance Ci as the first and third integrators StI1 and StI3.

What claimed is:

1. A controllable integrator for a bipolar integrated filter comprising:
    a voltage-current-transformer including two transistors, a converting resistor connected between the emitters of said two transistors, and two current sources each connected to a respective one of the emitters of said two transistors;
    a source of supply voltage;
    a current distribution multiplier including: two logarithmic diodes each having a terminal connected to a respective one of the collectors of said two transistors; a differential stage having differential inputs connected, respectively, to said terminals of said two logarithmic diodes, a current input and an output; a first controllable current source for supplying current to the current input of said differential stage; and a current mirror having an output and comprising two transistors of one conductivity type having emitters connected to said source of supply voltage and collectors connected to the output of said differential stage;
    a second controllable current source having the same current as the current flowing in the controllable current source in said current distribution multiplier;

an integrating amplifier including: an inverting amplifier having an input and an output; an integrating capacitor connected between the input and output of said inverting amplifier; and an input circuit including an input transistor of said one conductivity type, said input transistor having a base connected to the output of said current mirror, an emitter connected to said source of supply voltage and a collector connected to the input of said inverting amplifier and to said second controllable current source.

* * * * *